United States Patent [19]

Roberts et al.

[11] Patent Number: 5,797,114
[45] Date of Patent: Aug. 18, 1998

[54] METHOD AND APPARATUS FOR MAPPING OF SEMICONDUCTOR MATERIALS

[75] Inventors: John Roberts; Ian Leslie Freeston; Richard Charles Tozer, all of Sheffield; Anthony Charles Gorvin, Leichester; Ian Christopher Mayes, Beds; Francois Jean Djamdji, Herts; Stephen Richard Blight, Bucks, all of England

[73] Assignees: The University of Sheffield, Sheffield; Bio-Rad Microscience Limited, Hemel Hempstead, both of United Kingdom

[21] Appl. No.: 525,767

[22] PCT Filed: Mar. 23, 1994

[86] PCT No.: PCT/GB94/00603

§ 371 Date: Jan. 26, 1996

§ 102(e) Date: Jan. 26, 1996

[87] PCT Pub. No.: WO94/22027

PCT Pub. Date: Sep. 29, 1994

[30] Foreign Application Priority Data

Mar. 23, 1993 [GB] United Kingdom ............... 9305964

[51] Int. Cl.$^6$ .................................................. G01R 31/26
[52] U.S. Cl. ............................. 702/57; 324/525; 324/719; 324/724
[58] Field of Search ..................... 364/480–483, 364/550, 551.01, 552, 556, 582; 395/21; 324/525, 537, 719, 724, 754, 765

[56] References Cited

U.S. PATENT DOCUMENTS

| | | | |
|---|---|---|---|
| 4,617,939 | 10/1986 | Brown et al. | 128/734 |
| 4,703,252 | 10/1987 | Perloff et al. | 324/719 X |
| 4,755,746 | 7/1988 | Mallory et al. | 324/765 X |
| 4,857,839 | 8/1989 | Look et al. | 324/158 |
| 5,448,503 | 9/1995 | Morris et al. | 364/550 |

FOREIGN PATENT DOCUMENTS

| | | |
|---|---|---|
| 0273251 | 7/1988 | European Pat. Off. |
| 2119520 | 11/1983 | United Kingdom |

OTHER PUBLICATIONS

*Soviet Inventions Illustrated*, El section, week 8520, Jun. 26, 1985, Derwent Publications, Ltd., London & SU.A.1064 805.

*Primary Examiner*—Gary Chin
*Assistant Examiner*—Edward Pipala
*Attorney, Agent, or Firm*—Townsend and Townsend and Crew LLP

[57] ABSTRACT

A method and apparatus for resistivity mapping of semiconductor materials by causing currents to flow in a semiconductor body and measuring resultant potentials created between pairs of surface probes. A resistivity map is produced using the information gathered.

15 Claims, 8 Drawing Sheets

METHOD AND APPARATUS FOR MAPPING OF SEMICONDUCTOR MATERIALS

BACKGROUND OF THE INVENTION

The invention relates to developing maps of semiconductor materials. The maps can be used to detect inhomogeneities.

For semiconductors, resistivity inhomogeneities can arise due to non-uniformities in charge carrier concentrations or chemical and physical impurities. Also, inhomogeneities can arise due to local changes in thickness of materials. (For simplicity, such changes which give rise effectively to resistance variations will be referred to also hereinafter as resistivity variations.) Such non-uniformities arise as a consequence of growth processes for forming and/or subsequent heat treatments of semiconductor materials. Semiconductor materials in this context comprise amongst other things elemental (e.g., silicon, germanium, diamond), allow/compound (e.g., gallium arsenide, cadmium mercury telluride), and semi-insulating materials such as SI gallium arsenide.

Conventionally resistivity maps have been drawn up using a 4-point probe. (See for example, U.S. Pat. No. 4,204,155). The four points of the probe are typically in line or in a square configuration. Current is injected into the semiconductor body using two of the four points of the probe and the resulting potential is measured across the other two points of the probe. This method is slow in that the probe must repositioned for each measurement taken. It also requires a large number of measurements to be taken to build up an overall picture of the resistivity of the semiconductor body. In addition the response of a semiconductor body such as a wafer to an injected current will vary between its edge and say its centre. Compensations for these variations must therefore be made to measured potentials resulting from current flow in the wafer, further complicating the procedure. This method is also destructive as the probe contacts all parts of the wafer.

U.S. Pat. No. 4,857,839 discloses a technique for generating a database of information including resistivity values for an array of individual portions of a semiconductor wafer; a resistivity map can be produced from this database. Each such resistivity value is calculated from values of a current applied to the respective portion and of a directly measured voltage across the portion. The portion under examination is illuminated by a light pixel, and conductive paths to the illuminated portion from appropriate contact points at the wafer perimeter are formed in the wafer itself by illumination with light transmitted through a light mask.

Other techniques sometimes employed for resistance mapping of semiconductors include induced currents (eddy currents) or microwave methods. Probes adapted to generated currents in this fashion need to be calibrated with reference to a uniform body of known resistivity in order for absolute values of resistance to be obtained. Also, when currents are induced the materials under test need, in practice, to be obtained. Also, when currents are induced the materials under test need, in practice, to be highly conductive. This limits the range of material resistivities than can be sensibly measured. Again a point-by-point picture of a wafer can only be drawn up by moving the probe or wafer from location to location.

In accordance with one aspect of the invention there is provided a method of mapping the resistivity of a semiconductor body by placing a plurality of surface probes at spaced intervals on or near the semiconductor body, causing currents to flow in the semiconductor body, and measuring the resulting potential created between pairs of the surface probes, generating data representing the correspondence between the measured potentials and potentials determined assuming the semiconductor body has a predetermined configuration, and mapping the resistivity of the semiconductor body using the generated data.

The step of mapping the resistivity may comprise comparing the generated data with data representing at least one semiconductor body having a known resistivity pattern.

The assumed semiconductor body having a predetermined configuration may be a body of uniform resistivity. The step of generating data may comprise obtaining the differences between the measured and determined potentials and normalising the difference with respect to the determined potentials.

The step of mapping the resistivity may comprise calculating the positions of lines of isopotential passing through positions on the semiconductor body measured by the surface probes assuming the semiconductor body under test is of uniform resistivity. The assumed resistivity between the lines of isopotential is then modified in accordance with the generated data to form the resistivity map.

The invention can be applied to three dimensional bodies such as crystals, boules, cylinders etc. of semiconductor material. However, there are particular advantages in its application to quasi two dimensional geometries such as flat plates, slices, sheets or wafers. This is because in this type of application detected variations in resistivity are not influenced by current flow outside the plane under consideration to any great extent. In well controlled essentially two dimensional geometries measured variations are able to provide useful information regarding inhomogeneities at higher resolution than is possible with a three dimensional body in which measured potentials are influenced by current flow outside that plan as well as within it. As measured values depend on both the geometry and the planar resistance inhomogeneity of the body, if one of these configurations is known the other can be found. Alternatively, the more accurately one of the configurations is known the more accurately the other can be determined. For three dimensional semiconductor bodies current flow outside the plane reduces accuracy and resolution.

Improvements in resolution can, however, be achieved by accurately and reproducibly defining the location of probes that cause currents to flow in the semiconductor body with respect to that body. The accurate placement of probes enables calculation of the potentials expected from the semiconductor body used for comparison with the body under test to be achieved with greater precision. For testing quasi two dimensional semiconductor wafers, a probe card preferably provides probes which follow the perimeter shape of the wafer and which can be accurately located with respect to the centre of the wafer. By locating the contacts on or close to the wafer's perimeter the method avoids contact with the usable part of the wafer and is therefore essentially non-invasive.

Although current can be induced in the body using electromagnetic induction it is more usual to inject the current via contacts. This latter method has the advantage that the resistivity map can comprise absolute resistance values rather than relative values.

A method, used to date in medical imaging and fluid flow analysis, of causing currents to flow in a body using surface probe and measuring potentials generated again at the surface of the body to derive information on the configuration of the interior of the body, is known as electrical impedance tomography (EIT). The present invention resides at least partly in the recognition that the electrical impedance tomography techniques used in medical imaging and process control applications such as fluid flow in pipes can be applied to obtain resistivity maps for semiconductor materials.

The use of electrical impedance tomography lends itself particularly to resistance mapping of semiconductor bodies as it enables absolute measurements of inhomogeneities in the semiconductor body to be made. Absolute measurements are useful because they have a physical meaning i.e. concentration of charge carriers in a semiconductor body or thickness of say a semiconductor wafer. They are possible because for small variations in resistivity measured potentials are likely to be linearly related to variations in resistance which are used to determine the nature of inhomogeneities in the structure. In principle, nonlinearities in this relationship could be taken into account when calculating absolute resistivities. However, in practice the calculations are much simpler in systems where variations in resistance across the body are small. In quasi two dimensional semiconductor materials any variation in thickness across the body is likely to be extremely small as is any variation in current density concentration. Both are usually less than 10%.

Once variations in the body's resistance across a plane have been determined, these variations can be displayed in image form and/or used to determine thickness and/or temperature variations during manufacture in a quasi two dimensional material and/or charge carrier concentrations.

In accordance with a second aspect of the present invention there is provided a device for mapping the resistivity of a quasi two dimensional semiconductor body of known peripheral confirmation comprising:

a plurality of probes arranged on a probe card to conform with a peripheral configuration of the semiconductor body, means for energising two of the probes to enable currents to flow in the quasi two dimensional semiconductor body, means for measuring potentials generated between pairs of the probes as a result of currents flowing in the semiconductor body, means for generating data representing the correspondence between the measured potentials and potentials determined assuming the semiconductor body has a predetermined configuration, and means for mapping the resistivity of the semiconductor body using the generated data.

The method and apparatus of this invention have the advantage over prior art methods of producing resistivity maps that a high resolution map can be obtained with relatively few contacts being made with a body. As with the prior art induced current probes the contacts can be non-invasive in nature. Measurement times will in general be shorter than those possible with prior art methods for the same resolution map. The advantage that the number of contacts can be minimized for a given resolution is particularly useful for materials with which contact is difficult to make such as wide band gap semiconductors. In addition no compensations for position of a probe are necessary, again improving the precision of the map.

An embodiment of the invention will now be described in greater detail with reference to FIGS. 1 to 10 of the accompanying figures of which.

Figure 1:
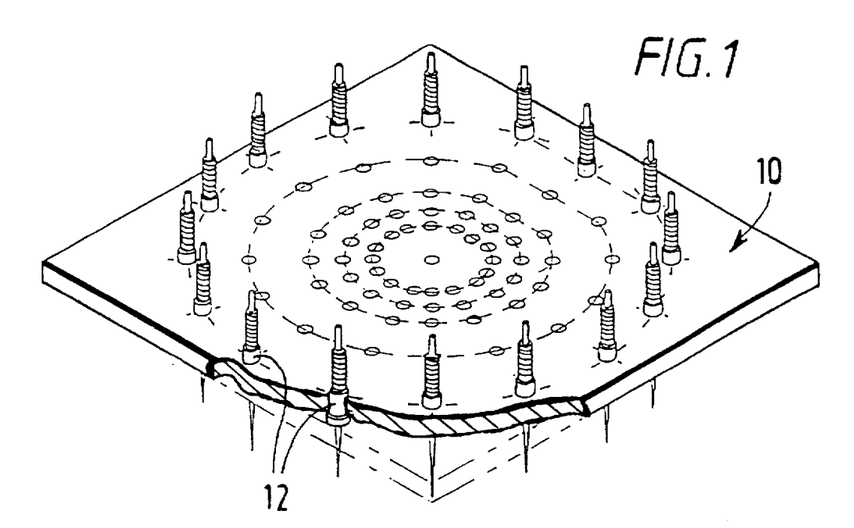
FIG. 1 is a typical probe card which holds probes in a fixed and known position.
Figure 2:
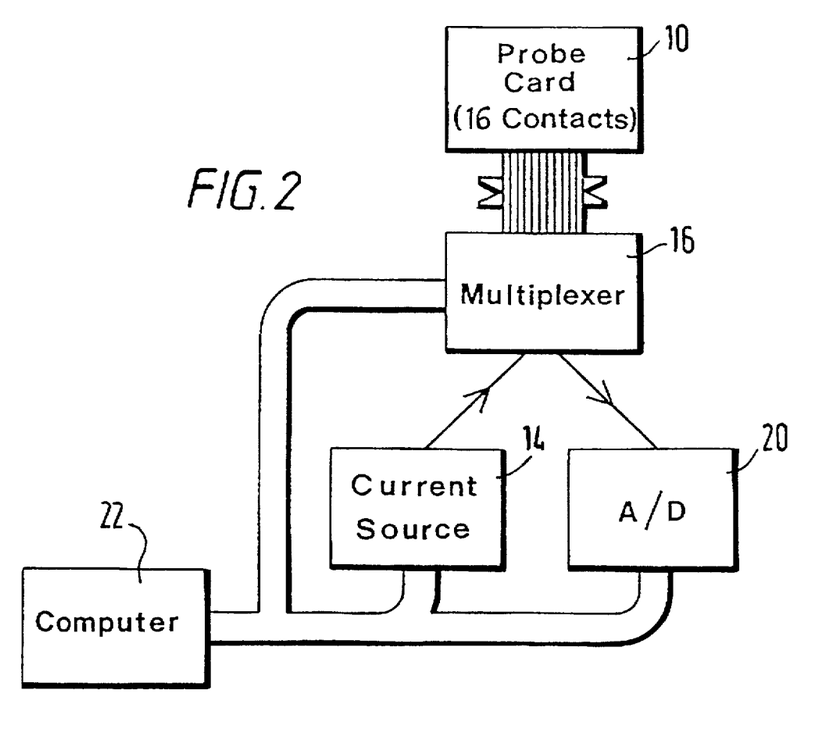
FIG. 2 is a block circuit diagram of the operation of the probe card.
Figure 3:
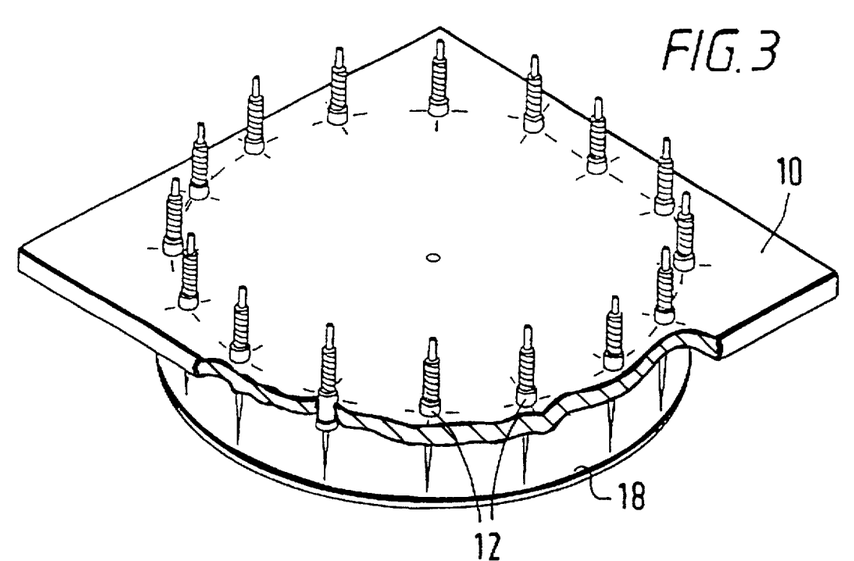
FIG. 3 shows the probe card of FIG. 1 with the probes in contact with a semiconduct wafer.

Referring to FIG. 1 and 2, a probe card 10 has sixteen probes 12 arranged in a circle. A current from a current source 14 is applied to each pair of adjacent probes 12 of the probe card 10 in turn by a multiplexer 16. The probes 12 contact the wafer of material 18 close to its periphery (FIG. 3). The probe card 10 and associated location mechanisms ensure the geometric relationship between each of the probes 12 and the wafer 18 is well defined and repeatable. For each pair of adjacent probes 12 receiving current from the current source 14, the resultant potential differences between every adjacent pair of probes 12 other than pairs including the probes receiving current is measured and converted to a number by the Analogue to Digital A/D converter 20. The A/D converter 20 contains, as necessary, appropriate signal conditioning circuitry. The current source 14, multiplexer 16 and A/D converter 20 are all controlled by a computer 22. FIG. 1 represents only one of the many possible circuit and probe arrangements. Additional circuitry may be required for example for improving contact between the probes 12 and wafer 18 or for controlling temperature. The probe card 10 configuration and/or the number and arrangement of the probes 12 could be different for use with differently shaped semiconductor bodies. For example thirty two probes could be used instead of sixteen.

Current may be caused to flow in the body by either applying an electrical potential between a pair of probes 12 in electrical contact with the wafer 18 (injection) or by electromagnetic induction (induction). Injection has the advantage of the injected current being known and in general gives better resolution. Induction has the advantage that the system can be made to operate without physical contact between the wafer and probes 12.

In the embodiment of FIG. 3 current is caused to flow by injection. It is, therefore, important that good contact is achieved between the probes 12 and the semiconductor wafer 18. Contact can be achieved in different ways depending on the nature of the semiconductor material of the wafer 18. Some possibilities for making contact include touch, application of pressure, capacitive coupling and contact formed by passing an electric current between the wafer 18 under test and the probes 12. The material used for contact again depends on the nature of the semiconductor and the contacting method to be employed. In general just touching a semiconductor with a metal probe does not result in the ohmic (i.e. allowing current to flow equally well in both directions) contact it is desirable to achieve as merely touching a semiconductor with a metal probe usually results in a rectifying contact.

When the wafer 18 under test is formed from silicon a reasonable contact between the probes on the wafer 18 can be made by applying pressure to a probe comprising a hard tungsten carbide needle. In this instance the contact is thought to be formed as a result of micro-cracking at the tip of the probe and this technique is commonly employed in conventional four-point probe system on this material. For wafers made from materials where the potential barrier height is high, such as gallium arsenide, it is difficult to make an ohmic contact. Contact quality can be improved in this instance by forwarding biasing the contact thereby collapsing the barrier or by alloying an appropriate material to the semiconductor at contact points. For wafers of gallium arsenide, indium, tin and zinc are commonly employed in allowing. The contact can be produced using standard deposition processing giving well-defined contact pads on the wafer 18 or by coating the tip of the probe 12 with the appropriate contact material and then passing a current between the probe and the wafer under test. In the latter case, local heating at the tip of the probe 12 alloys some of the material on the tip of the probe with the wafer.

The quality of the contact achieved between the probe 12 and the wafer 18 is checked by observing how the voltage between any two contacts varies as the current between them is changed. Ideally the voltage should change linearly with current. Lack of such linear relationship indicates a poor contact. Poor contact can also be spotted by abnormal variations in measurements used to produce the resistivity map. Also instability of the map produced is a possible pointer to poor contacts. Once contact quality has been detected steps can be taken to improve contact where it is found to be non-ideal. If, however, this appears to be impossible measurements can proceed using only those problems that provide good contact. This reduction in the number of serviceable probes results in reduced resolution in mapping the resistivity.

For injected currents the source is preferably a constant current generator, in this case the current source 14. For low to medium resistance materials AC drives are preferred as, for this type of drive, small signal levels are more easily measured, thermo-electric effects can be removed and contact quality in materials with high barrier heights can be improved by superposition of DC bias. However, the input impedance of the voltage measurement instrument should be greater than the impedance of the sample. As the input impedance of the voltage measuring instrument decreases with increasing frequency, high resistance materials require low frequencies, i.e., ultimately DC. For high resistance materials, such as semi-insulating GaAs, DC drives are therefore preferred.

Semiconductor materials are generally sensitive to temperature, light and other radiation. Resistivity maps can therefore be used to detect the influence of these on semiconductor materials. Because semiconductors are influenced by light and heat, measurements are usually made in the dark and at constant and known temperature. Narrow band gap semiconductors are often particularly sensitive to heat and require measurements to be conducted at low temperatures. Temperature stability is particularly important for materials with high temperature coefficients of resistivity.

As temperature is particularly important in semiconductor mechanisms, in principle measurements of resistivity as a function of temperature may provide useful information for semiconductor manufacture. For example, the high temperature coefficient of resistivity of semiconductors may be used to study temperature uniformity in wafer heating or cooling systems. In this case, measurements taken from a wafer at room temperature could be used to provide the reference data against which resistitives at higher and lower temperatures can be measured. This will remove any effect of contact location from the calculations.

Figure 5:
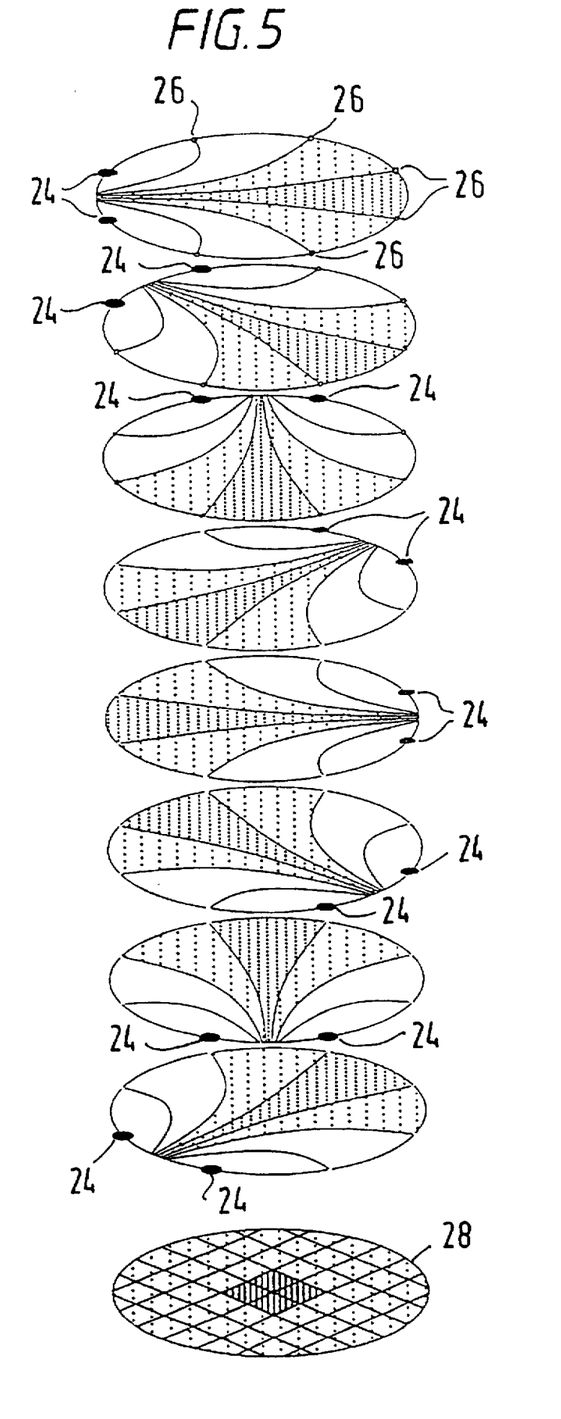
FIG. 5 is a schematic representation of the method of constructing a resistivity map.

FIG. 5 illustrates schematically operation of an embodiment of the method of this invention. Current is applied from the current source 14 between adjacent contacts 24. For simplicity only eight contacts are illustrated. For each pair of contacts being used to provide current, potential measurements are taken between each adjacent pair of the remaining contacts 26. For simplicity the algorithm used to construct a resistivity map assumes material between the lines of isopotential emanating from the contacts is of uniform resistivity (i.e., the body is of uniform resistivity). The measured potential differences between the lines are compared with computed values based on the assumption of uniform resistivity. The areas between the lines are then assigned values according to these differences. A suitable algorithm is described in greater detail in GB 2119520 A and U.S. Pat. No. 4,617,939. The final map 28 is constructed by adding the contributions obtained using potentials measured for each pair of adjacent contacts used to inject current to the semiconductor wafer.

The maximum amount of information, i.e. greatest resolution, is obtained by making measurements for all unique 'contact sets'. A 'contact set' comprises a current drive pair of probes 12 and a voltage sense pair of probes where none of the contacts of the current drive pair and the voltage sense pair are shared. A contact set measurement is deemed to be unique if it cannot be synthesized by a combination of data from other contact sets. A number of configurations of contact sets are possible. However, in this embodiment 16 probes are employed and current is injected via a current drive pair of adjacent probes 12 with potentials being measured between pairs of adjacent probes 12 starting with a pair of probes adjacent to but not common with either of the pair of current drive probes and finishing with the pair of probes adjacent on the other side to, but not common with, either of the pair of current drive probes. This avoids interference from contact resistance.

Sets of potentials are collected for each of the possible sets of drive contacts and constitute the measured data set.

EXAMPLE 16 contacts

Current drive pair $I_{x,y}$

Potential sense pair $V_{p,q}$

Tomography measurements:

| Drive Contacts | Measured Data Set | | |
|---|---|---|---|
| $I_{1,2}$ | $-V_{3,4}\ V_{4,5}\ V_{5,6}\ V_{6,7}$ | $\ldots V_{15,16}$ | (13 readings) |
| $I_{2,3}$ | $-V_{4,5}\ V_{5,6}\ V_{6,7}\ V_{7,8}$ | $\ldots V_{16,1}$ | (13 readings) |
| $I_{3,4}$ | $-V_{6,6}\ V_{6,7}\ V_{7,8}\ V_{8,9}$ | $\ldots V_{1,2}$ | (13 readings) |
| $I_{4,5}$ | $-V_{6,7}\ V_{7,8}\ V_{8,9}\ V_{9,10}$ | $\ldots V_{2,3}$ | (13 readings) |
| | | $\ldots$ | |
| | | $\ldots$ | |
| | | $\ldots$ | |
| $I_{16,1}$ | $-V_{2,3}\ V_{3,4}\ V_{4,5}\ V_{5,6}$ | $\ldots V_{14,15}$ | (13 readings) |
| Total number of measurements 16 × 13 | | | 208 |

In this example reciprocity dictates that the contact set $(I_{x,y}\ V_{p,q})$ will give the same result as the contact set $(I_{x,y}\ V_{p,q})$; consequently only 104 values are unique and contribute to the resolution. In practice all 208 values are used. This over sampling provides a level of noise reduction as a result of smoothing the data by averaging.

The measured potential data set is then compared with values that would be obtained from a uniform semiconductor wafer of the same geometry, known as the reference potential data set. This information is used to compute non-uniformity. The reference potential data set can be calculated using numerical methods or be obtained from measurements on a suitable uniform body or by any other appropriate means.

Figure 4:
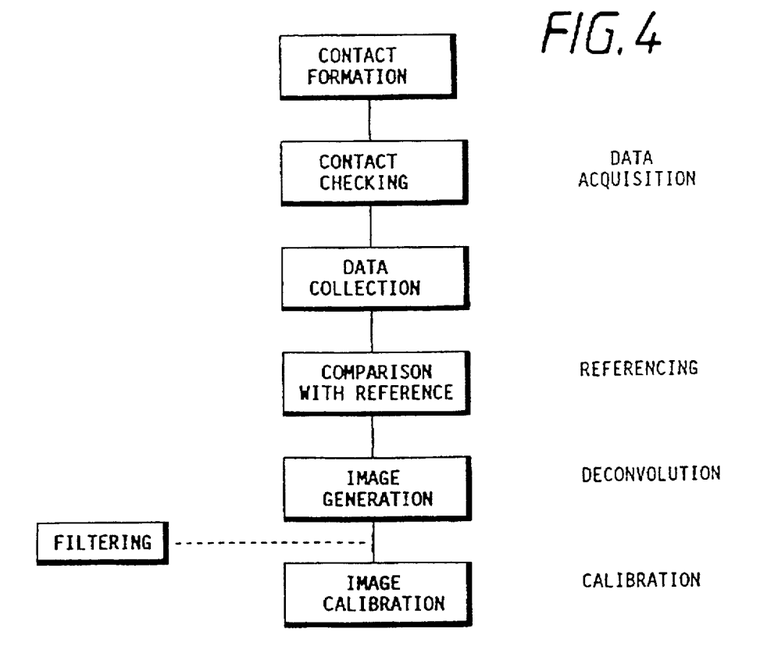
FIG. 4 is a flow chart illustrating the steps employed to generate an image using the hardware illustrated in FIG. 2.

A convenient way of depicting resistivity variations is by generating an image in which differences in pixel intensity correspond to differences in measured potential. The steps in the measurement process to such image generation are illustrated in FIG. 4.

Figure 11:
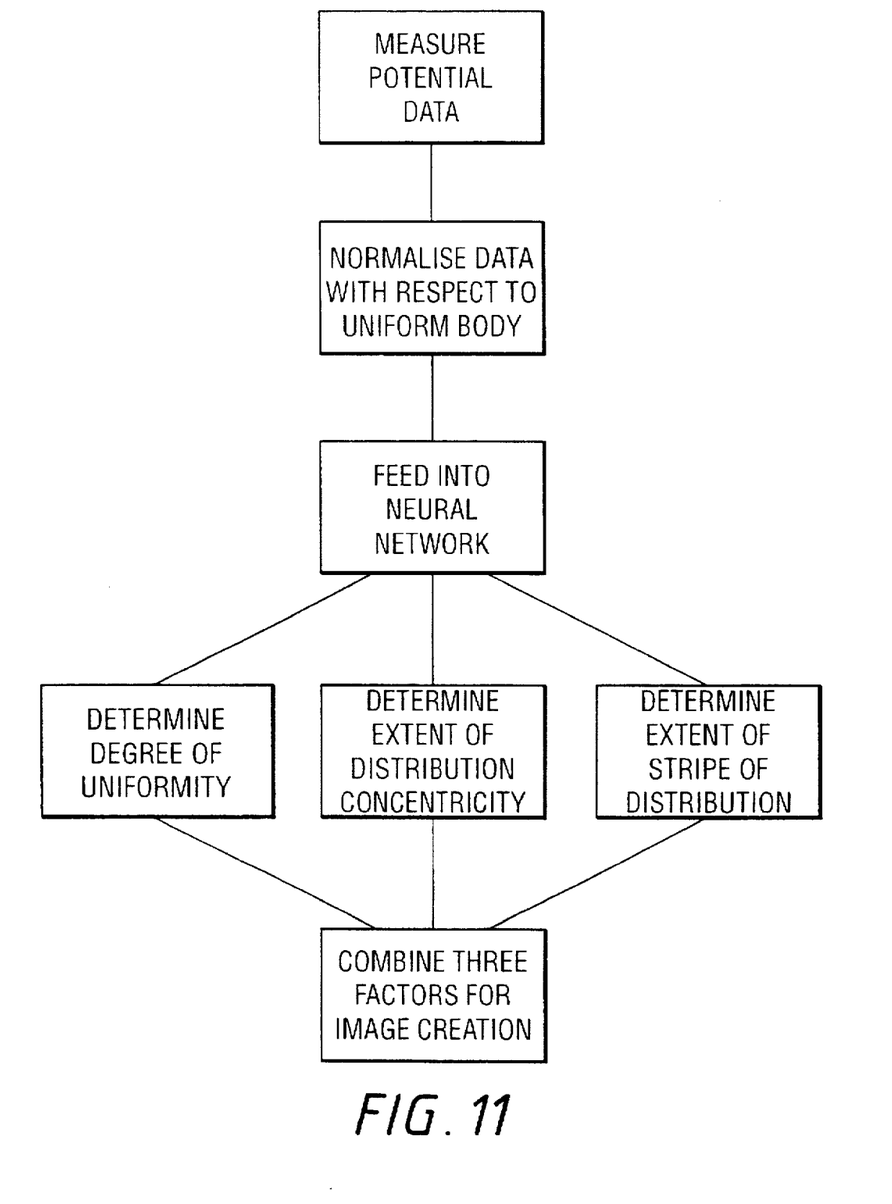
FIG. 11 is a flow chart showing steps involved in generating an image depicting detected resistivity variations of a semiconductor wafer.

The image is created from difference between the measured data set and the reference data set. There are a number of methods for doing this. At the present time the most successful of these is described in GB 2119520 A and U.S. Pat. No. 4,617,939. One other option might, however, be to feed measured potential data normalised with respect to uniform body into a neural network which has as its inputs all the normalised potential measurement data and as its outputs three figures representing respectively: the degree of uniformity; extent to which it is striped. An image is created by combining the three figures in accordance with the extent to which the measured data agrees with each figure as shown in the flow chart of FIG. 11. Instead of forming an image these three values together with the average resistivity of the wafer could be used as a figure of merit to qualify wafers.

In this particular embodiment, although this is not necessarily always the case, the image at this stage comprises relative differences between pixel intensities. Absolute resistance can be obtained by independently extracting the average resistivity of the whole body from the measured data set. This can be done in a number of ways, the simplest of which is to use the analysis published, by Van der Pauw (A Method of Measuring Specific Resistivity and Hall Effect of Disc of Arbitrary Shape by L. J. Van der Pauw, Philips Research Reports 13, 1–9, 1958) and average the computed resistivity over a number of readings in the measured data set. Once the average resistivity of the body is known absolute values of resistance can be ascribed to the pixel intensities.

For the back projection method described in GB 2119520 and U.S. 4,617,939, providing the variation of resistivity in the semiconductor body is not too great, the calibration process is essentially linear i.e. the relative difference between the pixel values corresponds to the logarithm of the relative difference in resistivity enabling absolute values to be ascribed. As discussed above this is only likely to be true for small variations in resistance as the potential changes observed at the boundary as a result of local internal changes in resistivity are diluted by current flow in the remainder of the semiconductor body which is largely unchanged. In principle these non-linearities could be taken into account if it is found necessary and hence measurement of large resistivity variations is not precluded.

Figure 6:
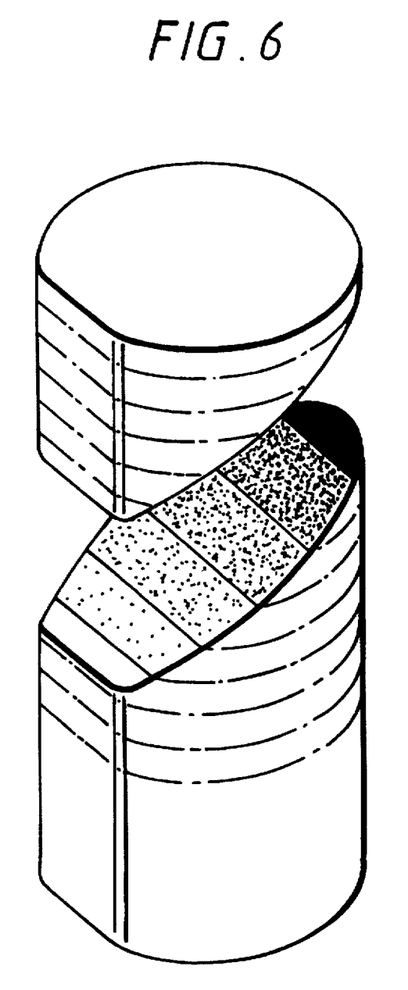
FIG. 6 is a schematic illustration showing the expected variation of dopant in a Bridgemen grown crystal cut at the angle illustrated.
Figure 7:
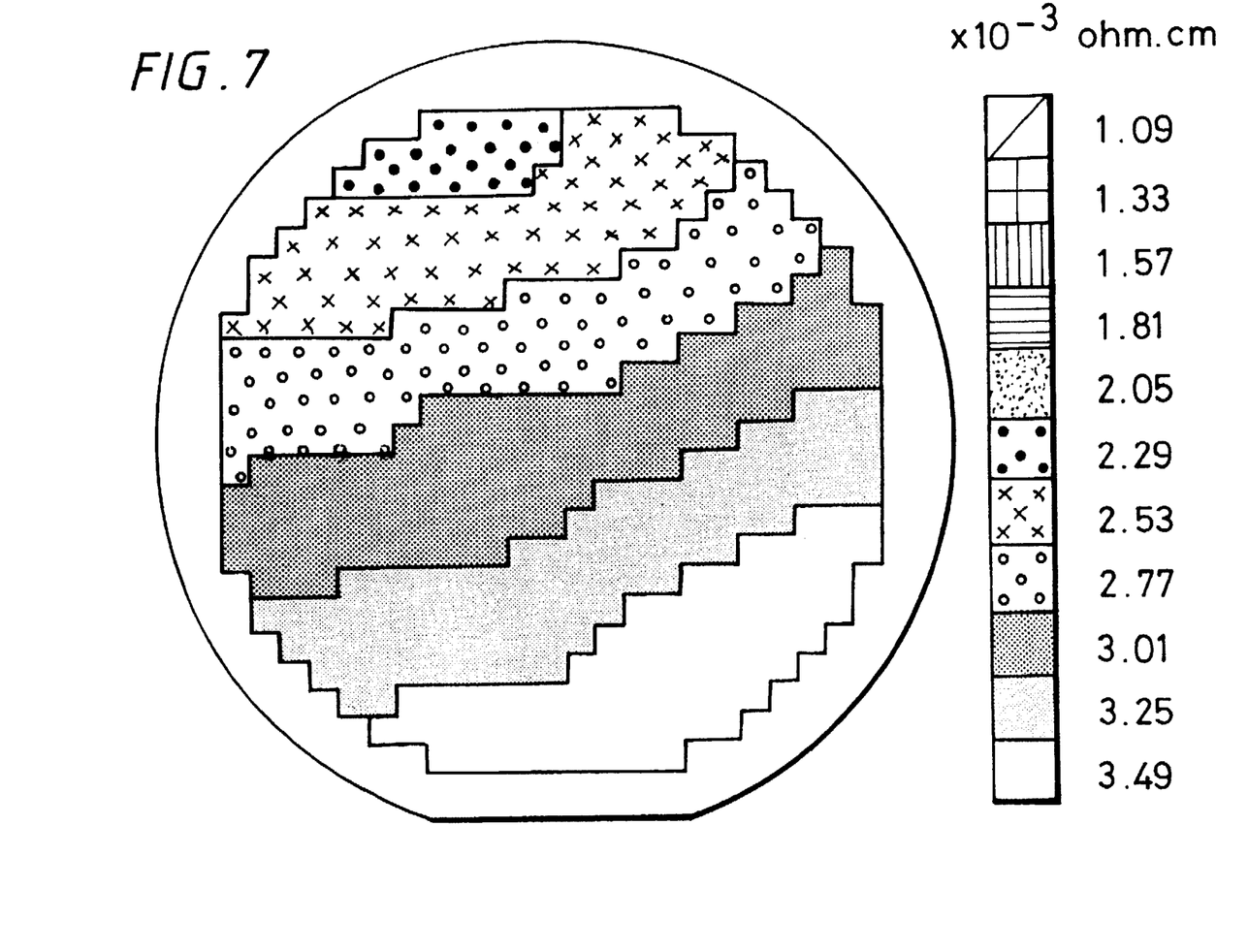
FIG. 7 is a conventionally produced resistivity map using a 4-point square array probe of a p-type gallium arsenide wafer formed in the manner illustrated in FIG. 6.
Figure 8:
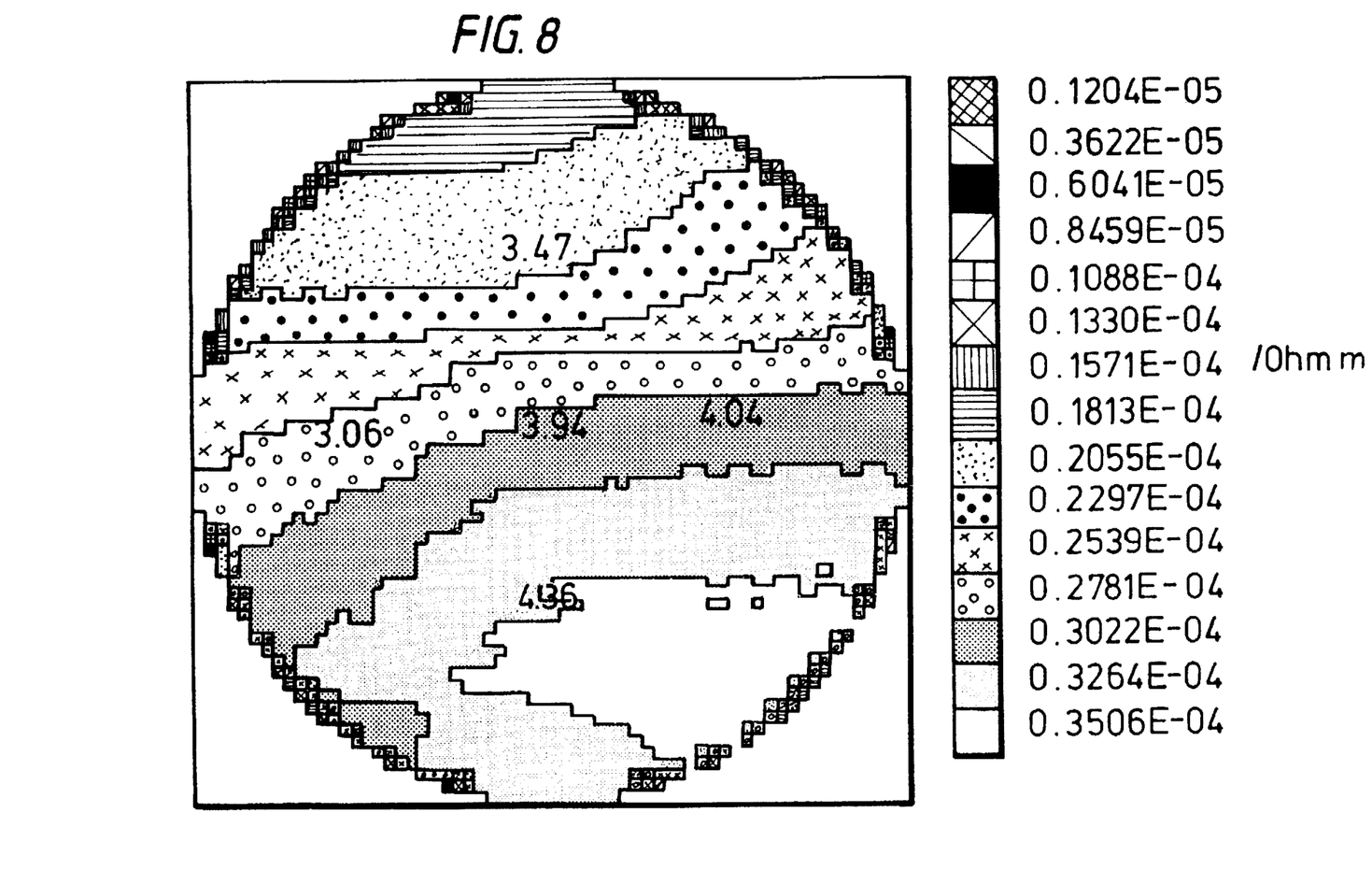
FIG. 8 is a printout of an electrical impedance tomography (EIT) image of a p-type gallium arsenide wafer formed in the manner illustrated in FIG. 4.

Examples of resistivity maps generated in accordance with an embodiment of the present invention are now discussed with reference to FIGS. 6 to 10 of the drawings. FIG. 6 schematically illustrates a wafer of gallium arsenide which has been obtained by cutting at an angle from a horizontally grown crystal. This method of obtaining wafers often results in a striped variation in resistivity across the wafer. A resistivity map of a wafer formed in this fashion generated by conventional 4-point probe systems is illustrated in FIG. 7. For comparison FIG. 8 shows the higher resolution picture obtainable using a reduced number of contacts generated by an embodiment of the present invention. The numerals present on the map of FIG. 8 represent another sat of data generated for comparison by RF techniques.

Figure 9:
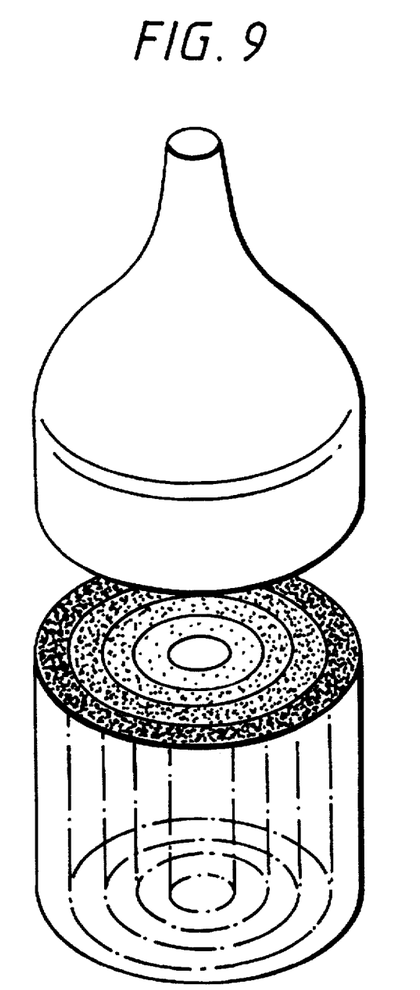
FIG. 9 is a schematic illustration showing the expected variation of dopant in an InP wafer taken by slicing a crystal grown by the Czochralski method perpendicular to the direction of pulling.
Figure 10:
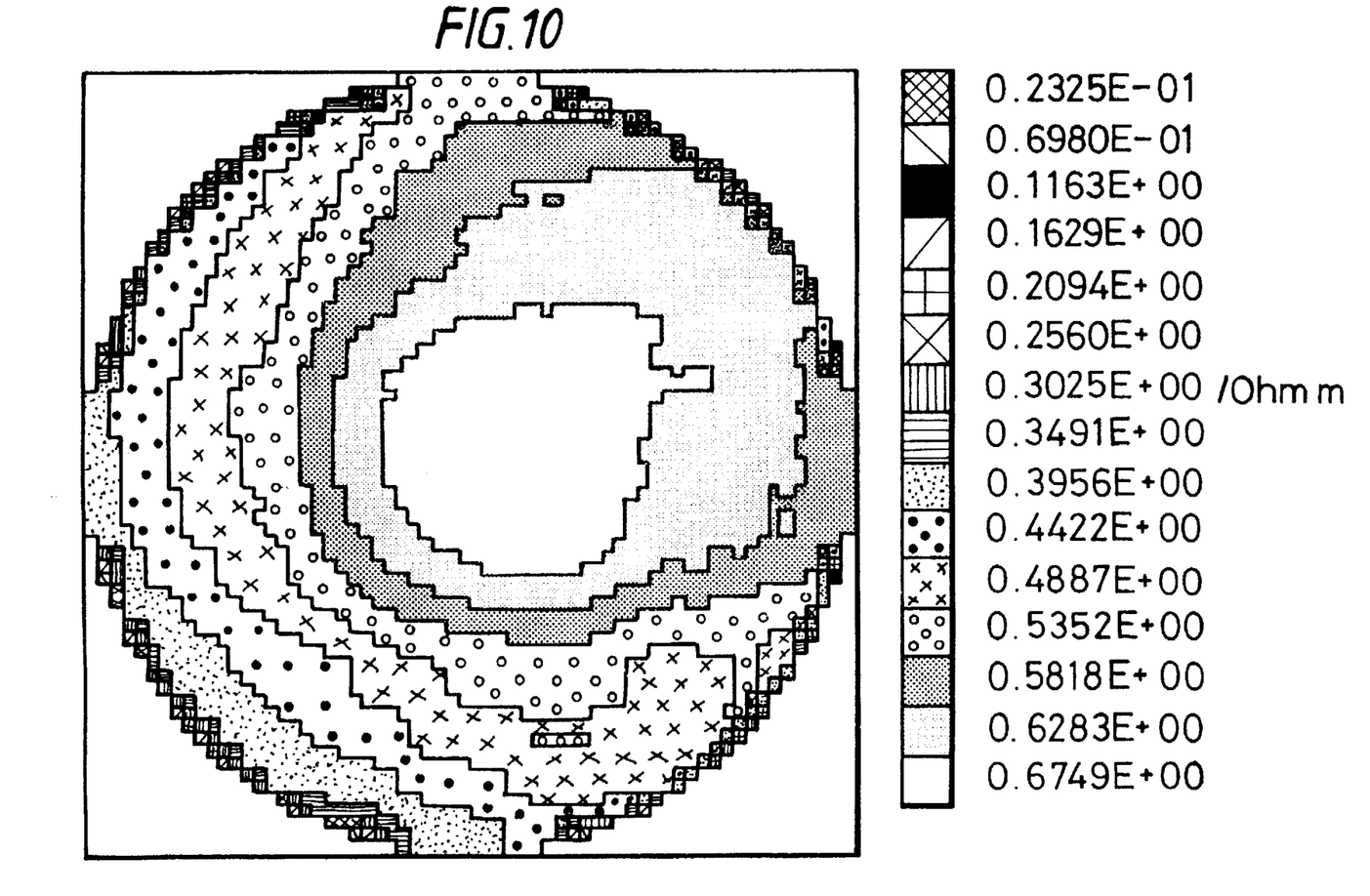
FIG. 10 is a printout of a EIT image for an InP wafer of FIG. 9.

By way of further illustration FIG. 9 shows an InP wafer formed by slicing a vertically grown crystal perpendicular to the direction of pulling and FIG. 10 shows the resistivity map obtained using an embodiment of the present invention which indicates the variation of resistivity falling into concentric circles. This is to be expected when this growth process method is used in generating wafers.

Embodiments of the present invention enable high resolution resistivity maps to be obtained of semiconductor wafers and other semiconductor bodies with far fewer contacts than would be necessary in conventional resistivity mapping methods. Different probe configurations and analysis techniques could be used to implement the invention.

As mentioned above, references to assuming particular configurations when mapping resistivities are intended to encompass assuming particular resistivity when mapping configurations.

What is claimed is:

1. A method for mapping the resistivity of a quasi two dimensional semiconductor body said method comprising the steps of: placing an array of surface probes at spaced intervals on or near the semiconductor body at its periphery, causing currents to flow in the semiconductor body by successively energising different pairs of said probes and, for each such energisation of a pair of said probes, determining the effect of said energisation upon the potential distribution throughout the body by measuring the resulting potentials created at different regions around the entire periphery between each adjacent pair of the non-energised surface probes, generating data representing the correspondence between the measured potentials and potentials determined assuming the semiconductor body as a predetermined configuration, and mapping the resistivity of the semiconductor body using the generated data.

2. A method according to claim 1 wherein the step of mapping the resistivity comprises comparing the generated data with data representing at least one semiconductor body having a known resistivity pattern.

3. A method according to claim 1, wherein the assumed semiconductor body having a predetermined configuration comprises a body of uniform resistivity.

4. A method according to claim 1, wherein the step of generating data comprises obtaining the ratio between the measured potentials and the determined potentials.

5. A method according to claim 1, wherein the step of generating data comprises obtaining the difference between the measured and determined potentials and normalising the difference with respect to the determined potentials.

6. A method according to claim 1, wherein the step of mapping the resistivity comprises calculating the relationship between current flow in the semiconductor body and the resultant potentials on all the surface probes then modifying the assumed resistivity distribution to match the measured potentials on the semiconductor body.

7. A method according to claim 1, wherein the step of mapping the resistivity comprises processing the generated data using a neural network.

8. A method according to claim 1, wherein changes in resistivity determined in the mapping over the semiconductor body are calculated as thickness variations in the quasi two dimensional body.

9. A method according to claim 1, wherein variations in the resistivity mapping over the semiconductor body are calculated as charge carrier concentration variations in the quasi two dimensional body.

10. A method according to claim 1, wherein variations in the resistivity mapping over the semiconductor body are calculated as temperature variations in the quasi two dimensional body.

11. A method according to claim 1, wherein the resistivity mapping of the semiconductor body is displayed as an image in which the relative changes in intensity of pixels of the image correspond to relative changes in resistivities across the body.

12. A method according to claim 1, wherein an average resistivity of the semiconductor body is determined and the resistivity mapping is given absolute resistance values.

13. A device for mapping the resistivity of quasi two dimensional semiconductor body of known peripheral configuration comprising:

a plurality of at least sixteen probes arranged on a probe card to conform with the peripheral configuration of the semiconductor body, means for concurrently energising a first pair of adjacent probes to enable currents to flow in the quasi two dimensional semiconductor body, means for measuring potentials generated between pairs of the probes, other than said first pair, as a result of currents flowing in the semi-conductor body, means for generating data representing the correspondence between the measured potentials and potentials determined assuming the semi-conductor body has a predetermined configuration, and means for mapping the resistivity of the semi-conductor body using the generated data.

14. A device for mapping the resistivity of a quasi two dimensional semiconductor body of known peripheral configuration comprising:

an array of surface probes arranged on a probe card to conform with the peripheral configuration of the semiconductor body, means for causing currents to flow in the quasi two dimensional semiconductor body by successively energizing different pairs of said surface probes, means operable for each said energization of a pair of said surface probes, to measure the resulting potentials created at different regions around the entire periphery between each adjacent pair of the non-energised surface probes so as to determine the effect of said energisation upon the potential distribution throughout the body, means for generating data representing the correspondence between the measured potentials and potentials determined assuming the semi-conductor body has a predetermined configuration, and means for mapping the resistivity of the semi-conductor body using the generated data.

15. A device for mapping the resistivity of a quasi two dimensional semiconductor body of known peripheral configuration comprising:

an array of surface probes arranged on a probe card to conform with the peripheral configuration of the semiconductor body;

a current generator that causes currents ot flow in the quasi two dimensional semiconductor body by successively energizing different pairs of said surface probes;

a measuring unit, operable for each said energisation of a pair of said surface probes, that measures the resulting potentials created at different regions around the entire periphery between each adjacent pair of the non-energised surface probes so as to determine the effect of said energisation upon the potential distribution throughout the body;

a data processing unit that generates data representing the correspondence between the measured potentials and potentials determined assuming the semi-conductor body has a predetermined configuration, and means for mapping the resistivity of the semiconductor body using the generated data.

* * * * *